United States Patent [19]
Sugizaki et al.

[11] Patent Number: 5,882,778
[45] Date of Patent: Mar. 16, 1999

[54] HARD COATING OF EXCELLENT WEAR RESISTANCE AND HARD COATING COATED MEMBER THEREOF

[75] Inventors: Yasuaki Sugizaki; Chunghsien Tsai, both of Kobe; Tsutomu Ikeda, Akashi; Yasuyuki Yamada, Akashi; Yusuke Tanaka, Akashi; Yasunori Wada, Akashi; Yasushi Onishi, Akashi, all of Japan

[73] Assignee: Kabushiki Kaisha Kobe Sieko Sho, Kobe, Japan

[21] Appl. No.: 819,489

[22] Filed: Mar. 17, 1997

Related U.S. Application Data

[63] Continuation of Ser. No. 562,596, Nov. 24, 1995, abandoned.

[30] Foreign Application Priority Data

Dec. 14, 1994 [JP] Japan ..................................... 6-311004

[51] Int. Cl.$^6$ .................................................. L23C 14/06
[52] U.S. Cl. ........................... 428/216; 428/336; 428/697; 428/698; 428/704
[58] Field of Search ..................... 428/698, 336, 428/216, 704, 697

[56] References Cited

U.S. PATENT DOCUMENTS

| 4,714,660 | 12/1987 | Gates, Jr. | 428/699 |
|---|---|---|---|
| 4,970,092 | 11/1990 | Gavrilov et al. | 427/37 |
| 5,208,102 | 5/1993 | Schulz et al. | 428/698 |
| 5,318,840 | 6/1994 | Ikeda et al. | 428/336 |
| 5,330,853 | 7/1994 | Hofmann et al. | 428/697 |
| 5,580,653 | 12/1996 | Tanaka et al. | 428/698 |

FOREIGN PATENT DOCUMENTS 0 306 077  3/1989  Germany.

*Primary Examiner*—Archene Turner
*Attorney, Agent, or Firm*—Oblon, Spivak, McClelland, Maier & Neustadt, P.C.

[57] ABSTRACT

A hard coating formed on a substrate material and having a first layer and a second layer of which, the first layer is a compound composed of one or more types of metallic elements selected to include at least aluminum or titanium from a group comprising aluminum, titanium and silicon; and also selected from one or more types of non-metallic elements from a group comprising boron, carbon and nitrogen, and the second layer is a lamination of AlBN on the surface.

16 Claims, No Drawings

HARD COATING OF EXCELLENT WEAR RESISTANCE AND HARD COATING COATED MEMBER THEREOF

This application is a Continuation of application Ser. No. 08/562,596, filed on Nov. 24, 1995 now abandoned.

BACKGROUND OF THE INVENTION

1. Field of the Invention

This invention relates to a hard coating as a surface coating material for cutting tools used in machining methods such as milling, cutting and drilling, or as a surface coating for wear resistant material in parts requiring high hardness such as molds, bearings, dies, and rollers, or as a surface coating material for heat resistant and corrosion resistant members used in molding machines such as screws and cylinders. This invention further relates to a hard coating coated member having excellent wear resistance due to the hard coating thereon.

2. Description of the Related Art

In cutting tools such as high speed and carbide cutting tools which require high wear resistance, hard coatings consisting of TiN and TiC are formed on the surface of cutting tools in order to improve the wear resistance.

In comparing the wear resistance of the above TiN and TiC, TiN has an oxidation resistance superior to TiC at high temperature and demonstrates good wear resistance to crater abrasion occurring on the cutting tool surface from cutting or frictional heat generated during cutting. The TiN also demonstrates superior adhesive properties to the substrate material. The TiC on the other hand, has higher hardness than the TiN and demonstrates high durability with respect to flank wear where the tool flank surface contacts the work piece.

However even in TiN which has superior oxidation resistance, the temperature at which oxidation starts is at most about 600° C. and even in high hardness TiC, the Vickers hardness is at most about 2,000, therefore, in either case further improvement is needed.

At which point, for example in Japanese Patent Laid-open No. 2-194159, in an effort to improve the oxidation resistance and hardness of the TiN and TiC, nitrogen compounds of Al and Ti and carbon-nitrogen compounds with aluminum replacing a portion of the Ti (titanium) was used {hereafter shown by (Al, Ti) (C,N)}. This improved the oxidation temperature to approximately 800° C. and the Vickers hardness to about 2500.

The inventors of this patent completed patent application for a hard coating demonstrating excellent wear resistance, good resistance to oxidation and high hardness, by means of replacing a portion of the elements with other elements and utilizing an aluminum-titanium-nitride compound as a base. For instance the (Al, Ti) (B,N) in Japanese Patent Laid-open No. 4-26756 had an oxidation temperature of approximately 800° C. and a Vickers hardness of 3400. Also the (Al, Ti, Si) (C,N) film (Japanese Patent Application No. 6-100154) had an oxidation temperature of approximately 1000° C. and a Vickers hardness of 3100.

However it is necessary to develop a hard coating having even better wear resistance for applications in fields requiring an even higher performance such as in cutting tools.

SUMMARY OF THE INVENTION

In the light of these circumstances, this invention has the object of providing a hard coating demonstrating wear characteristics which are a yet further level of improvement over hard coatings developed up until now, to have good wear resistance. This invention is also intended to provide a hard coating coated member by means of said hard coating, a member for which even further wear resistance is required.

In order to achieve these objectives, the hard coating of this invention is formed on the surface of a substrate material having a first layer and a second layer. The said first layer is formed on the substrate material and is a compound composed of one or more types of metallic elements selected to include at least aluminum or titanium from a group comprising aluminum, titanium and silicon; and also selected from one or more types of non-metallic elements from a group comprising boron, carbon and nitrogen, while the said second layer is an AlBN deposited on the surface.

In the said first layer, use of compounds in one of the chemical constituent combinations shown in the formulas (1) through (3) below, is recommended

 (1)

where, $0.25 \leq a \leq 0.75$ $0 \leq b \leq 0.4$

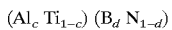 (2)

where, $0.05 \leq c \leq 0.75$ $0.02 \leq d \leq 0.12$

 (3)

where, $0.05 \leq x \leq 0.75$ $0.01 \leq y \leq 0.1$ $0 \leq z \leq 0.4$

The above variables a, b, c, d, x, y, z are all in atomic ratio.

In the explanation below, the coating comprising the first said coating (one or more types of metallic elements selected to include at least Al or Ti from a group comprising Al, Ti and Si; and one or more types of non-metallic elements from a group comprising B, C and N) has the general name of (Al, Ti, Si) (B, C, N).

The thickness of the said hard coating is preferably 0.1 to 20 μm for both the first and second layers, and when the said hard coating is formed on the substrate material, a hard coating member having excellent wear resistance is obtained.

As the result of an evaluation by the inventors as to how to improve the wear resistance of the (Al, Ti, Si) (B, C, N) coating even further, a protective coating of AlBN was formed over the said (Al, Ti, Si) (B, C, N) coating with a good adhesion property. This protective coating AlBN increased the overall hardness and also the oxidation resistance and was successful in finally achieving a large-scale improvement in the wear resistance of the hard coating.

The reason why the hard coating of this invention demonstrates superior wear resistance compared to conventional hard coatings is not precisely understood but is thought to be as follows. Namely in that coating the surface of the (Al, Ti, Si) (B, C, N) coating, with a good adhesion coating of AlBN which has a small friction coefficient along with high hardness and excellent wear resistance, gives the overall coating a high Vickers hardness of 3500 and also forms a protective layer of aluminum oxides in the aluminum in the AlBN surface layer to provide the oxidation resistance required at high temperatures ranges. Further, this protective layer comprising aluminum oxides formed on the surface of the lower (Al, Ti, Si) (B, C, N) layer, has an extremely fine structure.

The AlBN layer of this invention has excellent affinity and reactivity with the (Al, Ti, Si) (B, C, N) layer which in turn allows forming a good adhesive with the lower (Al, Ti, Si) (B, C, N) layer. Furthermore, since there is no damage to the adhesion between the (Al, Ti, Si) (B, C, N) layer and substrate material, the problem of peeling at the interface seldom occurs and a hard coating member can be obtained having a hard coating that amply demonstrates superior wear resistant characteristics.

The reason that the AlBN coating of this invention can be formed to have good adhesion with the lower (Al, Ti, Si) (B, C, N) coating is not clear in some respects, however according to the "Journal of Hard Materials" (Vol.2, No.3–4, 1991, P233–243), a reaction layer for instance of AlN, TiN, $TiB_2$ is formed at the interface of the compound cBN-TiAlN. In the case of this invention, a reaction layer comprising alloys such as AlN, TiN, $Si_3N_4$, $TiB_2$ is formed at the interface of (Al, Ti, Si) (B, C, N) and the AlBN. This reaction layer is thought to remarkably increase the. adhesive characteristics of the layers.

Limits are not placed on the constituents of the AlBN coating of this invention but when $Al_p$ $B_q$ $N_{1-p-q}$ is specified, conditions in which p and q respectively satisfy $0.01 \leq p \leq 0.3$, $0.2 \leq q \leq 0.6$ are preferable. These conditions are recommended because when the value of p is less than 0.01, a sufficient improvement in hardness and improved adhesion cannot be obtained due to the aluminum content in the AlBN coating. On the other hand, when the value of p exceeds 0.3, the crystalline structure changes from a cubic to a hexagonal crystalline structure the same as AlN, and the hardness of the coating may decline and the resulting wear resistance is insufficient. When the value of q is less than 0.2 or exceeds a value of 0.6, the hardness of the layer declines and the resulting wear resistance is insufficient. The value of p is preferably 0.03 or more, with an upper limit of 0.1 preferred. The value of q is preferably 0.4 or more, with an upper limit of 0.55 preferred.

In the hard coating of this invention, the first layer formed on the substrate material displays excellent wear resistance due at least to the synergistic effect of the (Al, Ti, Si) (B, C, N) coating with the AlBN coating, also preferable in particular is that the coating include at least one or more types of Al or Ti shown by the chemical constituents in (1) through (3) below. The reason for including at least one or more types of Al or Ti in the said first layer of this invention is as stated previously, to form a reaction layer at the interface of the AlBN coating of the second layer, and to increase adhesive property.

$$(Al_a Ti_{1-a}) (C_b N_{1-b}) \tag{1}$$

where, $0.25 \leq a \leq 0.75$ $0 \leq b \leq 0.4$ $$(Al_c Ti_{1-c}) (B_d N_{1-d}) \tag{2}$$

where, $0.05 \leq c \leq 0.75$ $0.02 \leq d \leq 0.12$ $$(Al_x Ti_{1-x-y} Si_y) (C_z N_{1-z}) \tag{3}$$

where, $0.05 \leq x \leq 0.75$ $0.01 \leq y \leq 0.1$ $0 \leq z \leq 0.4$

The reason for setting the chemical constituents of (1) through (3) in their respective ranges is related next.

(1) In order for the $(Al_a Ti_{1-a}) (C_b N_{1-b})$ to demonstrate superior wear resistance, the value a, in the $(Al_a Ti_{1-a})$ portion of the metallic element must satisfy conditions such that $0.25 \leq a \leq 0.75$. When the value a, is less than 0.25 an adequate improvement in oxidation resistance cannot be obtained. When the value a exceeds 0.75, the crystalline structure of the coating changes from a cubic type to a hexagonal crystalline structure, the hardness of the coating declines and adequate wear resistance cannot be obtained. A lower limit of 0.45 is preferable for the a value, and a value over 0.56 is even more preferable. An upper limit of 0.70 is preferable for the a value, and should preferably be less than 0.65.

The first layer of the hard coating of this invention displays superior wear resistance with a nitrogen compound or a carbon-nitrogen compound of the said metallic element. However when the value b for the $(C_b N_{1-b})$ exceeds 0.4, the oxidation resistance of the coating declines so that a condition of $0 \leq b \leq 0.4$ is preferable. A value b, within 0.2 is preferable for oxidation resistance characteristics.

(2) In order for the $(Al_c Ti_{1-c}) (B_d N_{1-d})$ to demonstrate superior wear resistance, the value c, in the $(Al_c Ti_{1-c})$ portion of the metallic element must satisfy conditions such that $0.05 \leq c \leq 0.75$. When the value c, is less than 0.05 an adequate improvement in oxidation resistance cannot be obtained. When the value c, exceeds 0.75 the crystalline structure of the coating changes from a cubic type to a hexagonal (crystalline structure), the hardness of the layer declines and adequate wear resistance cannot be obtained. A lower limit of 0.25 is preferable for the c value, and a value over 0.50 is even more preferable. An upper limit of 0.70 is preferable for the c value, and should preferably be less than 0.65.

The first layer of the hard coating of this invention displays superior wear resistance with a boron-nitrogen compound of the said metallic element. In particular, it is preferable that the d value in $(Al_c Ti_{1-c}) (B_d N_{1-d})$ satisfy the condition $0.02 \leq d \leq 0.12$. When the value d is below 0.02, the improved hardness effect is insufficient due to the boron additive. On the other hand, when the value d exceeds 0.12, a portion of the NaCl crystalline structure becomes amorphous, and conversely the undesired effect of a drop in hardness appears. A preferable lower limit value for d is 0.03, and an upper limit value of 0.08 is more preferable.

(3) In order for the $(Al_x Ti_{1-x-y} Si_y) (C_z N_{1-z})$ to demonstrate superior wear resistance, the values x and y, in the $(Al_x Ti_{1-x-y} Si_y)$ portion of the metallic element must respectively satisfy conditions such that $0.05 \leq x \leq 0.75$, $0.01 \leq y \leq 0.1$. When the values x, is less than 0.05, or the y value is less than 0.01 an adequate improvement in oxidation resistance cannot be obtained. When the value x exceeds 0.75, or when the value y exceeds 0.1 the crystalline structure of the coating changes from a cubic type to a hexagonal crystalline structure, the hardness of the coating declines and adequate wear resistance cannot be obtained. A lower limit of 0.25 is preferable for the x value, and an x value over 0.56 is more preferable. An upper limit of 0.7 is preferable for the x value. A lower limit of 0.02 is preferable for the y value, the y upper limit value should preferably be 0.08 and more preferably within 0.05.

The first layer of the hard coating of this invention displays superior wear resistance with a nitrogen compound or a carbon-nitrogen compound of the said metallic elements. However when the value z for the ($C_z N_{1-z}$) exceeds 0.4, the oxidation resistance of the coating declines so that a condition of $0 \leq z \leq 0.4$ is preferable. A value z, within 0.2 is even more preferable for oxidation resistance characteristics.

The thickness of the said hard coating of this invention is preferably within 0.1 to 20 $\mu$m for both the first and second layers. The reason being that when the thickness of the said hard coating is less than 0.1 $\mu$m, insufficient wear resistance is obtained and on the other hand, when the thickness exceeds 20 $\mu$m, undesirable cracks may appear in the hard coating due to impact forces.

When the hard coating of this invention is a coating for cutting tools, it is preferable to fully utilize the superior wear resistance of the hard coating, yet still preserve the essential characteristics of the cutting blade. From this viewpoint, the hard coating of this invention should preferably 1 $\mu$m or more, more preferably 2 $\mu$m or more, for both the first and second layers. An upper limit less than 12 $\mu$m is preferable, and a limit within 8 $\mu$m is even more preferable.

This invention is not limited in the material of the substrate coated by the hard coating, however in order to have good adhesion with the substrate material, and demonstrate superior wear resistance; hard materials such as WC-carbides, high-speed tool steels, die steels, cermet and ceramics etc. are suitable.

A PVD method typified by ion plating methods and sputtering methods etc. can be used as methods for forming the first layer for coating the substrate material surface with the hard coating of this invention. The method listed below can be utilized when for instance, the arc deposition type ion plating method is employed. Namely this involves ionizing the metallic elements (Al, Ti, Si) from the cathode with a vaporizing source by means of arc discharge and forming the nitrogen compound and/or the carbon compound on the substrate material by means of ion plating in a $N_2$ atmosphere and/or a $CH_4$ atmosphere. A target added with boron can be used in the said metallic elements when forming boron compounds. Further, if a target having the desired composition of the coating is used that is the same as the metallic constituents (including boron when needed), then a stable coating with few deviations from the consistant composition can be easily obtained. Also, it is preferable that a biased electrical charge is applied to the substrate material, while ion plating is performed since adhesion performance can be further enhanced.

This invention is not in particular limited to the gas pressure during the ion plating process, however a range of about $1 \times 10^{-3}$ to $5 \times 10^{-2}$ Torr is preferable. If the gas pressure is set within this range, then a dense and highly crystallized hard coating can be easily obtained having excellent wear resistance.

This invention is not limited in the method for forming the AlBN coating however the previously mentioned ion plating method or the ion assisted deposition methods can be utilized. When using the ion plating method, the AlBN can be formed on the substrate material by utilizing a target composed of aluminum and boron, and causing a reaction of the ionized aluminum and boron in the $N_2$ atmosphere. In the ion-assisted deposition method irradiating With an electron beam, separate crucibles each filled with aluminum or boron, vaporizes the aluminum and boron and by causing a reaction in the nitrogen ions, forms a coating of AlBN on the substrate material. Preferably a bias charge is applied to the substrate material at this time, since adhesion of the coating will be even further improved.

This invention, structured as described above, utilizes the features of the hard coatings developed up until now and provides a hard coating demonstrating superior wear resistance of a yet higher level. This invention further is able to provide a hard coating member coated with said hard coating, to meet industry demands for members having high wear resistant characteristics.

DESCRIPTION OF THE PREFERRED EMBODIMENTS

The embodiment is described below but this invention need not be restricted to the embodiment below with appropriate changes in accordance with the general idea being included within the technical scope of this invention.

First embodiment

First, the substrate material made from platinum foil in dimensions of 10 mm×25 mm is mounted in an ion plating apparatus and the first layer then formed with the method described next. After the said substrate material is then heated to 400° C., the constituents of the basic elements comprising the first layer other than $N_2$ are vaporized by the cathode, while $N_2$ is fed in as a reactive gas at an atmosphere of $7 \times 10^{-3}$ Torr. Test samples coated with a 5 $\mu$m coating were then fabricated with the various constituents for forming the first layer as shown in Table 1, by applying a bias voltage of 150V. The constituents of the layer were verified with inductively-coupled argon plasma spectroscopy and Auger electon spectroscopy methods.

After forming the first layer of the hard coating of this embodiment, the electron beam gun inside the said ion plating apparatus, the aluminum and boron in their separate crucibles are vaporized by irradiation from the electron beam gun. While the vacuum inside the ion plating unit is made to reach $5 \times 10^{-4}$ Torr and a reaction is caused by the nitrogen ion beam output of 500 eV on the aluminum and boron vapor, a 3 $\mu$m thick coating of AlBN is formed by application of a bias voltage of −150 volt on the substrate. The constituents of this layer were verified by electron probe micro analysis and Auger electron spectroscopy methods.

When the resulting test samples were used to perform oxidation tests under the conditions below, the results shown in Table 1 were obtained.

Oxidation test conditions

Temperature range: Room temp. to 1300° C.

Rate of temperature increase: 10° /min

Atmosphere: Dry air, 1 atm

Air flow rate: 150 cc/min

TABLE 1

| No. | First layer | Second layer | Oxidation temperature (C°) | Hardness (Hv) | Remarks |
|---|---|---|---|---|---|
| 1 | (Al, Ti)N | none | 820 | 2720 | Conventional embodiment |
| 2 | TiN | AlBN | 910 | 3550 | Embodiment of |

TABLE 1-continued

| No. | First layer | Second layer | Oxidation temperature (C°) | Hardness (Hv) | Remarks |
|---|---|---|---|---|---|
| 3 | (Al, Ti)N | AlBN | 950 | 3780 | Embodiment of this invention |
| 4 | (Al, Ti) (C, N) | AlBN | 920 | 4120 | Embodiment of this invention |
| 5 | (Al, Ti) (B, N) | none | 840 | 2950 | Conventional embodiment |
| 6 | (Al, Ti) (B, N) | AlBN | 1020 | 4380 | Embodiment of this invention |
| 7 | (Al, Ti, Si) (C, N) | none | 950 | 3060 | Conventional embodiment |
| 8 | (Al, Ti, Si) (C, N) | AlBN | 1250 | 4460 | Embodiment of this invention |
| 9 | None | AlBN | 570 | 2520 | Comparison sample |
| 10 | (Al, Ti)N | BN | 820 | 2950 | Conventional embodiment |

When conventional embodiments (No. 1, 5, 7) not formed with AlBN coating as a second layer, were each compared with embodiment of this invention (No. 3, 6 and 8) having an AlBN coating as a second layer, the oxidation temperature was found to be higher, clearly showing that the oxidation resistance properties of the hard coating of this invention were improved.

No. 9 is a comparison sample formed with an AlBN coating and having no (Al,Ti,Si) (B,C,N) coating formed as the first layer. The essential features of the AlBN coating cannot be demonstrated and the oxidation temperature is low, since the adhesion with the substrate material is poor.

No. 10 is a conventional embodiments with a second layer of BN formed on the first layer of (Al, Ti)N. The adhesion of the second layer is insufficient and the oxidation resistance is weak when compared with the hard coating of this invention.

Second Embodiment

WC-Co carbide chips were utilized as the substrate material, and test samples were fabricated using the same methods as for the first embodiment except that the coating thicknesses were each 10 μm. When the micro-vickers hardness of their coatings was measured with a load of 100 grams, the results listed in the above Table 1 were obtained.

As clearly shown in Table 1, when the conventional embodiments (No.1, 5, 7) were compared with the embodiments of this invention (No.3, 6, 8) formed with an AlBN coating as the second layer on a first layer of the conventional, the micro-vickers hardness of the hard coating of this invention had increased to 1,000 or more, showing that the hardness had increased remarkably.

No. 9 is a comparison sample formed with an AlBN layer and without a first layer of (Al, Ti, Si) (B, C, N). The essential features of the AlBN coating do not appear and the micro-vickers hardness is low, since the adhesion with the substrate material is poor.

No. 10 is a conventional embodiment with a second layer of BN formed on the first layer of (Al, Ti)N. The adhesion of the second layer was insufficient and the oxidation resistance was found to be weak when compared with the hard coating of this invention.

Third Embodiment

Two blades endmills having an outer diameter of 10 mm were fabricated with a WC-Co carbide as the substrate material. Aside from the coating and the substrate material at each blade surface, the endmills were formed with the same method as in the first embodiment, for the hard coating shown in Table 2. In this case the thickness of the first layer and the second layer were 4 μm and 2 μm respectively. The coating thickness was 6 μm when only the first layer or when only the second layer was formed.

The surface coated endmill was subjected to a cutting test under the conditions below and when the wear on the endmill flank face was measured, the results listed in Table 2 were obtained.

Cutting Conditionscut

Cutting method: Down cut

Cutting material: SKD11 (hardness HB219)

Depth of cut: Rd 1 mm×Ad 10 mm

Cutting speed: 60 m/minute

Feed rate: 0.07 mm/tooth (270 mm/min)

Lubricant: Air blow

Cutting length: 50 m

TABLE 2

| No. | First layer | Second layer | Flank wear (mm) | Remarks |
|---|---|---|---|---|
| 1 | (Al, Ti)N | none | 0.135 | Conventional embodiment |
| 2 | TiN | AlBN | 0.059 | Embodiment of this invention |
| 3 | (Al, Ti)N | AlBN | 0.048 | Embodiment of this embodiment |
| 4 | (Al, Ti) (C, N) | AlBN | 0.057 | Embodiment of this invention |
| 5 | (Al, Ti) (B, N) | none | 0.123 | Conventional embodiment |
| 6 | (Al, Ti) (B, N) | AlBN | 0.052 | Embodiment of this invention |
| 7 | (Al, Ti, Si) (C, N) | none | 0.118 | Conventional embodiment |
| 8 | (Al, Ti, Si) (C, N) | AlBN | 0.052 | Embodiment of this invention |
| 9 | none | AlBN. | 0,620 | Comparison sample |
| 10 | (Al, Ti)N | BN | 0.149 | Conventional embodiment |

As clearly shown in Table 2, the endmills (No. 2, 3, 4, 6, 8) coated with the hard coating of this invention had small flank wear and excellent wear resistance when compared to the conventional samples (No.1, 5, 7, 10) and the comparison sample (No. 9).

Fourth Embodiment

Drills having an outer diameter of 10mm were fabricated to JIS standards with high-speed steel equivalent to JIS standard SKH51 used as the substrate material. Aside from this substrate material, the drills were formed with the same method as in the third embodiment and the blade of each drill was formed with a hard coating as shown in Table 3.

The drills thus obtained with this surface coating were utilized to carry out a cutting test under the following conditions to investigate cutting life, and the results listed in Table 3 were obtained.

Cutting Conditions

Cutting method: drilling, cutting each 5 drills

Cutting material: S55C (hardness HB220)

Cutting speed: 30 m/min

Feed rate: 0.2 mm/rev

Cutting length 25 mm (through hole)

Lubricant: Water soluble emulsion type cutting fluid

TABLE 3

| No. | First layer | Second layer | Average number of holes drilled | Remarks |
|---|---|---|---|---|
| 1 | (Al, Ti)N | none | 473 | Conventional embodiment |
| 2 | TiN | AlBN | 822 | Embodiment of this invention |
| 3 | (Al, Ti)N | AlBN | 948 | Embodiment of this invention |
| 4 | (Al, Ti) (C, N) | AlBN | 856 | Embodiment of this invention |
| 5 | (Al, Ti) (B, N) | none | 585 | Conventional embodiment |
| 6 | (Al, Ti) (B, N) | AlBN | 1025 | Embodiment of this invention |
| 7 | (Al, Ti, Si) (C, N) | none | 765 | Conventional embodiment |
| 8 | (Al, Ti, Si) (C, N) | AlBN | 1234 | Embodiment of this invention |
| 9 | none | AlBN | 108 | Comparison sample |
| 10 | (Al, Ti)N | BN | 456 | Conventional embodiment |

As clearly shown in Table 3, the drills (No. 2, 3, 4, 6, 8) coated with the hard coating of this invention were found to provide a large average number of drilled holes and a long cutting life when compared with the conventional embodiments (No. 1, 5, 7, 10) and the comparison sample (No.9).

Fifth Embodiment

The substrate material was fabricated using mold material equivalent to SKD61 of JIS standard and dimensions of 40×20×5 mm. Aside from the total thickness of the first and second layers being 10 μm, the sample pieces were formed with a hard coating as shown in Table 4, with the same method of the fourth embodiment.

When the test samples thus obtained were subjected to a heat cycle test under the conditions below and the durability investigated, the results in Table 4 were obtained.

Heat Cycle Test Conditions
  High temperature bath, duration: 800° C., 150 seconds
  Low temperture bath, duration: water cooling, 10 seconds

TABLE 4

| No. | First layer | Second layer | Number of cycles till crack generation occurs | Remarks |
|---|---|---|---|---|
| 1 | TiN 10 μm | none | 165 | Conventional embodiment |
| 2 | (Al, Ti)N 10 μm | none | 612 | Conventional embodiment |
| 3 | (Al, Ti)N 7 μ | AlBN 3 μm | 978 | Embodiment of this invention |
| 4 | (Al, Ti) (B, N) 10 μm | none | 368 | Conventional embodiment |
| 5 | (Al, Ti) (B, N) 7 μm | AlBN 3 μm | 1120 | Embodiment of this invention |
| 6 | (Al, Ti, Si)N 10 μm | none | 686 | Conventional embodiment |
| 7 | (Al, Ti, Si)N 7 μm | AlBN 3 μm | 1120 | Embodiment of this invention |

As clearly shown in Table 4, the test samples (No. 3, 5, 7) coated with the hard coating of this invention showed a large improvement in terms of the number of cycles until cracks occurred and also superior heat cycle resistance when compared with the conventional embodiments (No. 1, 2, 4, 6).

Sixth Embodiment

A hard coating was formed on the blade surface of the chip as shown in Table 5, using the same method as in the third embodiment except for the substrate material which utilized WC-Co carbide inserts.

Utilizing the chips obtained above coated with the hard coating, a cutting test was performed under the conditions listed below and when the wear on the flank face of the cutting insert was measured, the results listed in Table 5 were obtained.

Cutting Conditions
  Cutting material: S45C
  Cutting speed: 200 m/min
  Feed rate: 0.3 mm/rev
  Depth of cut: 2 mm
  Lubricant: Dry
  Cutting time: 40 min

TABLE 5

| No. | First coating | Second coating | Flank wear (mm) | Remarks |
|---|---|---|---|---|
| 1 | (Al, Ti,)N | None | 0.163 | Conventional embodiment |
| 2 | TiN | AlBN | 0.061 | Embodiment of this invention |
| 3 | (Al, Ti)N | AlBN | 0.059 | Embodiment of this invention |
| 4 | (Al, Ti) (C, N) | AlBN | 0.072 | Embodiment of this invention |
| 5 | (Al, Ti) (B, N) | none | 0.155 | Conventional embodiment |
| 6 | (Al, Ti) (B, N) | AlBN | 0.048 | Embodiment of this invention |
| 7 | (Al, Ti, Si) (C, N) | none | 0.106 | Conventional embodiment |
| 8 | (Al, Ti, Si) (C, N) | AlBN | 0.048 | Embodiment of this invention |
| 9 | none | AlBN | Cutting not possible for 15 mmins. due to abnormal wear | Comparison sample |
| 10 | (Al, Ti)N | BN | 0.112 | Conventional embodiment |

As clearly shown in Table 5, the inserts (No. 2, 3, 4, 6, 8) coated with the hard coating of this invention were found to show little flank wear and to have superior wear resistance when compared with the conventional pieces (No.1, 5, 7, 10) and the comparison sample (No. 9).

Seventh Embodiment

Cutting tools coated with a hard coating are subjected to wear due to various factors. Wear can occur due to the reaction between the cutting tool and the material being cut, and in particular the rake surface of items such as inserts, causes a reaction with the cutting material which may be a cause in accelerating crater wear.

In view of this, test samples covered with the hard coating shown in Table 6 were fabricated with the same method as in the first embodiment except that WC-Co carbide was utilized as the substrate material. The reaction resistance of the hard coating of said test samples was investigated by pressing in a widely used steel work piece as the cutting material, under high heat and high pressure with the test sample. An evaluation of the reaction resistance was performed to check for the presence of a reaction layer formed between the said hard coating and the steel work piece. The press-in conditions are shown below and the results are listed in Table 6.

Press-in Conditions
  Press-in material: S55C (hardness HB220)
  Press-in surface area: 0.25 cm$^2$
  Press-in load: 500 kgf
  Temperature: 800° C.

TABLE 6

| No. | First layer | Second layer | Reaction response | Remarks |
|---|---|---|---|---|
| 1 | (Al, Ti)N | none | present | Conventional embodiment |
| 2 | TiN | AlBN | none | Embodiment of this invention |
| 3 | none | AlBN | Cracks occur | Comparison Sample |
| 4 | (Al, Ti) (C, N) | AlBN | none | Embodiment of this invention |
| 5 | (Al, Ti)N | AlBN | none | Embodiment of this invention |

As clearly shown in Table 6, under high heat and high pressure, the hard coating of this invention (No. 2, 4, 5) was extremely stable and formed no reaction coating, in contrast to the conventional piece (No. 1) and the comparison piece (No. 3) in which a reaction coating formed and cracks were generated. The hard coating of this invention therefore showed excellent reaction resistance with respect to the material for cutting and clearly demonstrated stable wear resistance during high speed cutting or cutting of hard to cut materials.

What is claimed is:

1. A hard coating formed on the surface of a substrate material, said coating having a first layer and a second layer, wherein said first layer is formed on the substrate material and is a compound composed of (a) aluminum or titanium or a mixture thereof, and optionally silicon; and (b) boron, carbon or nitrogen, or a mixture thereof, and the said second layer is composed of AlBN.

2. The hard coating according to claim 1 in which the said first layer comprises chemical constituents as shown;

$$(Al_a Ti_{1-a}) (C_b N_{1-b})$$

where, $0.25 \leq a \leq 0.75$ $0 \leq b \leq 0.4$

3. The hard coating according to claim 2 wherein $0.45 \leq a \leq 0.70$, $0 \leq b \leq 0.2$.

4. The hard coating according to claim 3 wherein $0.56 \leq a \leq 0.65$.

5. The hard coating according to claim 1 in which the said first layer comprises chemical constituents as shown;

$$(Al_c Ti_{1-c}) (B_d N_{1-d})$$

where, $0.05 \leq c \leq 0.75$ $0.02 \leq d \leq 0.12$

6. The hard coating according to claim 5 wherein $0.25 \leq c \leq 0.70$, $0.03 \leq d \leq 0.08$.

7. The hard coating according to claim 6, wherein $0.50 \leq c \leq 0.65$. $0.02 < d < 0.12$ 8. The hard coating according to claim 1 in which the said first layer comprises chemical constituents as shown;

$$(Al_x Ti_{1-x-y} Si_y) (C_z N_{1-z})$$

where, $0.05 \leq x \leq 0.75$ $0.01 \leq y \leq 0.1$ $0 \leq z \leq 0.4$

9. The hard coating according to claim 8, wherein $0.25 \leq x \leq 0.7$, $0.02 \leq y \leq 0.08$, $0 \leq z \leq 0.2$.

10. The hard coating according to claim 9, wherein $0.56 \leq x \leq 0.7$, $0.02 \leq y \leq 0.05$.

11. The hard coating according to claim 1 wherein the AlBN has the formula $Al_p B_q N_{1-p-g}$ wherein $0.01 \leq p \leq 0.3$, $0.2 \leq q \leq 0.6$.

12. The hard coating according to claim 11, wherein $0.03 \leq p \leq 0.1$, $0.4 \leq q \leq 0.55$.

13. The hard coating according to claim 1 in which the said first layer has a thickness of 0.1 to 20 $\mu$m.

14. The hard coating according to claim 1 in which the said second layer has a thickness of 0.1 to 20 $\mu$m.

15. The hard coating according to claim 1, wherein the first and second layers each independently have a thickness of from about 1 $\mu$m to about 12 $\mu$m.

16. The hard coating according to claim 15, wherein the first and second layers each independently have a thickness of from about 2 $\mu$m to about 8 $\mu$m.

* * * * *

UNITED STATES PATENT AND TRADEMARK OFFICE
CERTIFICATE OF CORRECTION

PATENT NO. : 5,882,778

DATED : March 16, 1999

INVENTOR(S): Yasuaki SUGIZAKI, et al.

It is certified that an error appears in the above-identified patent and that said Letters Patent is hereby corrected as shown below:

On the Title page, item [73], the assignee name should be:

--[73] Assignee: Kabushiki Kaisha Kobe Seiko Sho, Kobe, Japan--

Signed and Sealed this

Fourth Day of April, 2000

*Attest:*

Q. TODD DICKINSON

*Attesting Officer*  *Director of Patents and Trademarks*